United States Patent
Lee

(10) Patent No.: US 10,324,299 B2
(45) Date of Patent: Jun. 18, 2019

(54) VIDEO WALL DISPLAY DEVICE

(71) Applicant: LG DISPLAY CO., LTD., Seoul (KR)

(72) Inventor: DongHoon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/722,873

(22) Filed: Oct. 2, 2017

(65) Prior Publication Data

US 2018/0113320 A1 Apr. 26, 2018

(30) Foreign Application Priority Data

Oct. 26, 2016 (KR) ........................ 10-2016-0139976

(51) Int. Cl.
| | | |
|---|---|---|
| G09F 13/04 | (2006.01) | |
| G02B 27/09 | (2006.01) | |
| G02B 3/00 | (2006.01) | |
| H05K 5/00 | (2006.01) | |
| G02F 1/1333 | (2006.01) | |
| G02F 1/1335 | (2006.01) | |
| G02B 3/08 | (2006.01) | |

(52) U.S. Cl.
CPC ....... *G02B 27/0961* (2013.01); *G02B 3/0043* (2013.01); *G02F 1/13336* (2013.01); *G02F 1/133526* (2013.01); *H05K 5/0017* (2013.01); *H05K 5/0021* (2013.01); *G02B 3/08* (2013.01); *G02F 2001/133562* (2013.01)

(58) Field of Classification Search
CPC .... G02B 27/0961; G02B 3/0043; G02B 3/08; G02F 1/13336; G02F 1/133526; G02F 2001/133562; H05K 5/0017; H05K 5/0021
USPC .......... 345/1.1–1.3, 102, 690–694; 362/97.1, 362/97.2, 97.3, 97.4, 317, 339; 349/619, 349/629, 630
See application file for complete search history.

(56) References Cited

U.S. PATENT DOCUMENTS

2006/0012733 A1    1/2006   Jin et al.
2015/0092395 A1    4/2015   Wu

FOREIGN PATENT DOCUMENTS

KR    10-2015-0019841 A    2/2015

*Primary Examiner* — William Choi
(74) *Attorney, Agent, or Firm* — Birch, Stewart, Kolasch & Birch, LLP

(57) ABSTRACT

A video wall display device can include a multi-panel unit including a first display panel and a second display panel, the first display panel having a first display area adjacent to the second display panel having a second display area; a first optical member disposed adjacent to a boundary between the first display area and the second display area; and a second optical member disposed on the first optical member, across the multi-panel unit and including a tapered portion, in which the tapered portion of the second optical member is inclined from an edge of the first display area or an edge of the second display area toward the boundary between the first display area and the second display area.

20 Claims, 10 Drawing Sheets

VIDEO WALL DISPLAY DEVICE

CROSS REFERENCE TO RELATED APPLICATION

The present application claims the priority benefit of Patent Application No. 10-2016-0139976, filed in the Republic of Korea on Oct. 26, 2016, which is hereby incorporated by reference for all purposes as if fully set forth herein.

BACKGROUND OF THE INVENTION

Field of the Invention

Embodiments of the present invention relate to a video wall display device, in which a plurality of display panels are connected to be used as a large single image output device, and the video wall display device can maintain resolution while ensuring image continuity in a boundary area of a connection portion at which display panels are connected to each other.

Description of the Related-Art

As the information society continues to develop, a demand for a display device for displaying an image has increased. In recent years, various types of display devices have been used, such as a liquid crystal display device, a plasma display device, and an organic light-emitting display device.

However, according to current technology, there is a limit in the size of a display panel for a display device. Therefore, in order to realize a large display device, a video wall display device has been used, which displays a single image by connecting a plurality of display panels or individual display devices. Such a video wall display device may be referred to as a multi-display device, a video wall, or the like.

FIG. 1 is a schematic view illustrating a related-art video wall display device. In FIG. 1, four display devices collectively display a single image of three apples.

As illustrated in FIG. 1, a video wall display device 1 displays partial images of one image through display screens 10-1, 10-2, 10-3, and 10-4, respectively. Each display device includes a non-display area 20 in which an image is not displayed. Therefore, no image is displayed in the non-display area 20 of each display device, and the entire image thus includes a portion that looks like it is cutting the image.

Especially, in the portion 21 in which the non-display areas 20 of the display devices are connected to each other, the area on which the image is not displayed is wider than that in the edge of a video wall. As a result, the image appears clearly cut off. This portion may make a viewer feel fatigued during watching, and hinder the viewer from recognizing content, and thus an effect according to the purpose of display, such as advertisement, may be reduced.

Such a non-display area may be shaped like a kind of frame having a predetermined width while surrounding the edge of a display panel, and the non-display area may be referred to as a bezel. The non-display area or a bezel area is an indispensable portion in which a gate driving circuit, a data driving circuit, or various signal lines are formed for driving a display panel.

Recently, research has been conducted to realize a narrow bezel by minimizing a bezel area in a display device. However, there is a limit in realizing the width of the bezel area to be less than a predetermined width.

That is, except for the ideal zero bezel, in a video wall display device implemented by connecting a plurality of individual display devices or display panels, there is a problem in that an image discontinuity phenomenon occurs in a panel connection portion. Thus, there is a need for a solution for the problem.

Therefore, in order to solve the problem of image discontinuity in a panel connection portion of a video wall display device, research has been conducted to arrange a predetermined optical means in the panel connection portion. However, in this technology, an image discontinuity phenomenon still occurs in a panel connection portion, and in particular, the resolution at the panel connection portion is lowered.

SUMMARY OF THE INVENTION

In view of the foregoing background, an aspect of embodiments of the present invention is to provide a video wall display device that can improve image discontinuity in a boundary area of a connection portion between display panels.

Another aspect of embodiments of the present invention is to provide a video wall display device having two optical members with different properties at the upper portion thereof, so that the video wall display device can provide an image, which is seamless even at a connection portion between display panels, and can maintain the resolution of the connection portion between the display panels to be the same as that of a display area located away from the connection portion.

Further, the aspects of embodiments of the present invention are not limited thereto, and other unmentioned aspects of the present invention may be clearly appreciated by those skilled in the art from the following descriptions.

In order to achieve the above-mentioned aspects, embodiments of the present invention provide a video wall display device, in which a first optical member and a second optical member are stacked on the upper portion of a multi-panel unit having display panels are connected to each other, so that the first optical member refracts light to be transmitted to a boundary area of a connection portion between the display panels and the second optical member again refracts and diffuses the light transmitted from the first optical member, thereby minimizing an image disconnection phenomenon in a boundary area of the video wall display device and continuously realizing a seamless image in the boundary area.

According to embodiments described above, the present invention can improve a problem of image discontinuity in a boundary area of a connection portion between display panels.

In addition, according to embodiments of the present invention, the present invention can solve a problem of image discontinuity in a connection portion of a video wall display device and provide an image having uniform luminance across the entire area of the video wall display, and can increase the luminance of a backlight unit in the connection portion of the video wall display device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

Figure 1:
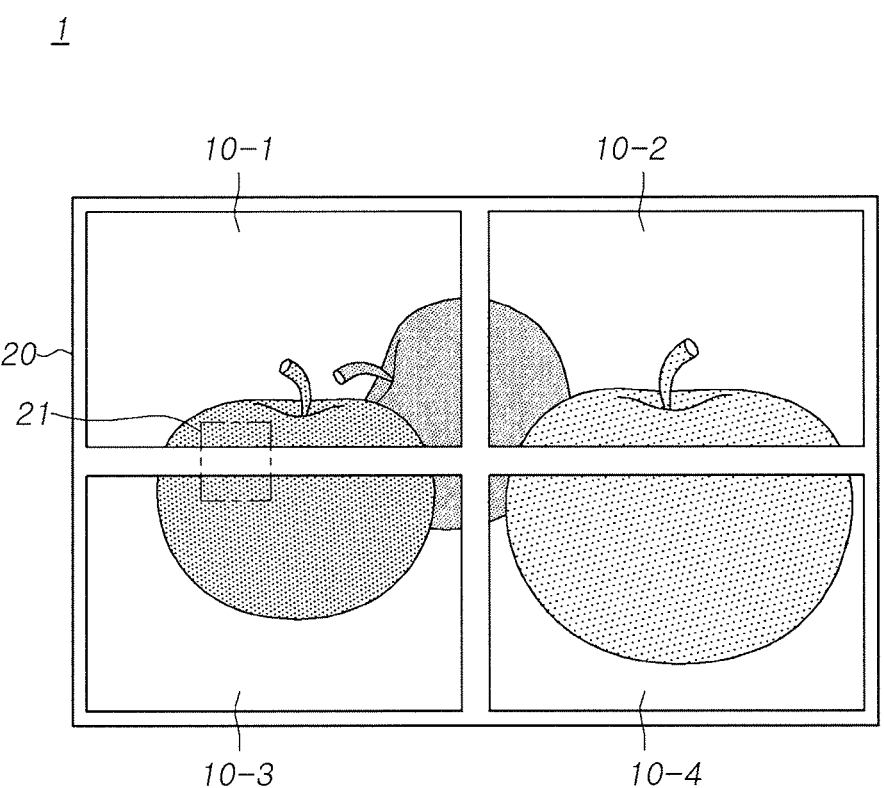
FIG. 1 is a schematic view showing a related-art video wall display device.

Hereinafter, some embodiments will be described with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the situation that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

Figure 2:
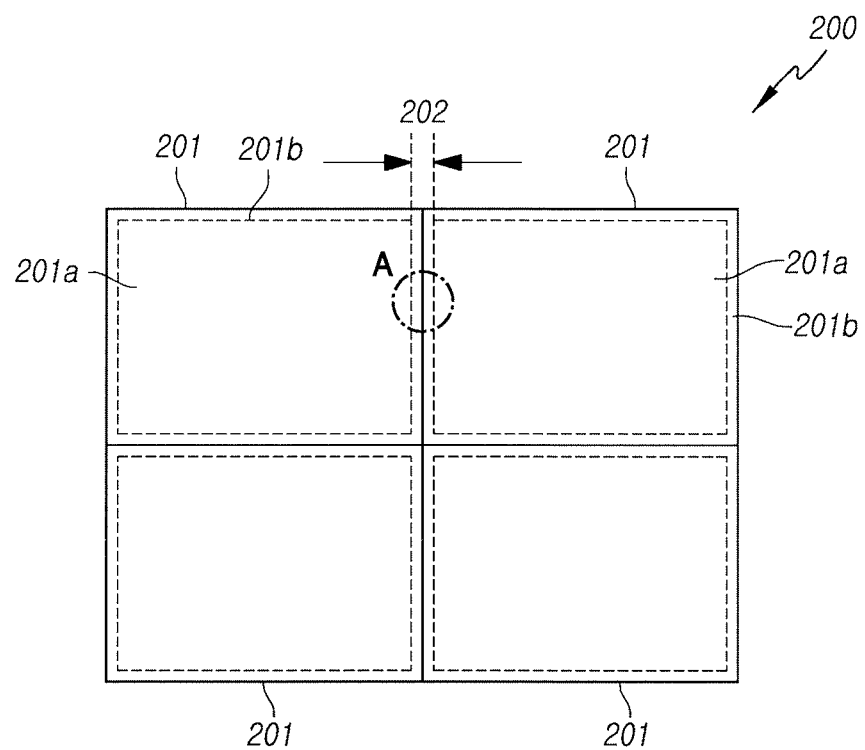
FIG. 2 is a front view schematically showing a video wall display device according to embodiments of the present invention.
Figure 3:
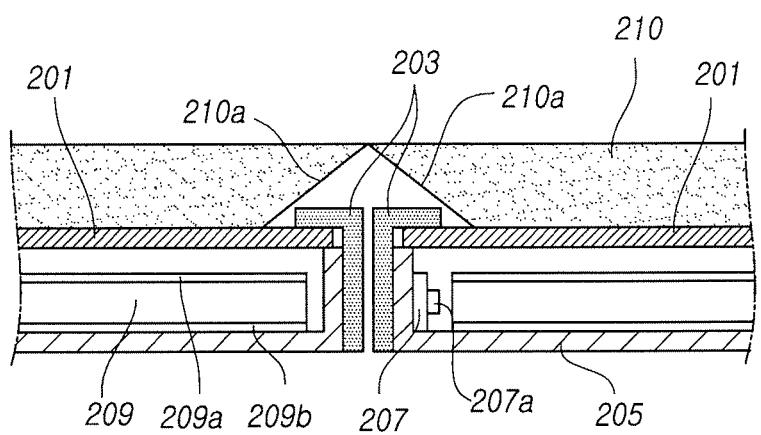
FIG. 3 is a cross-sectional view schematically showing a cross-section at the A-site in FIG. 2 according to an embodiment of the present invention.
Figure 4:
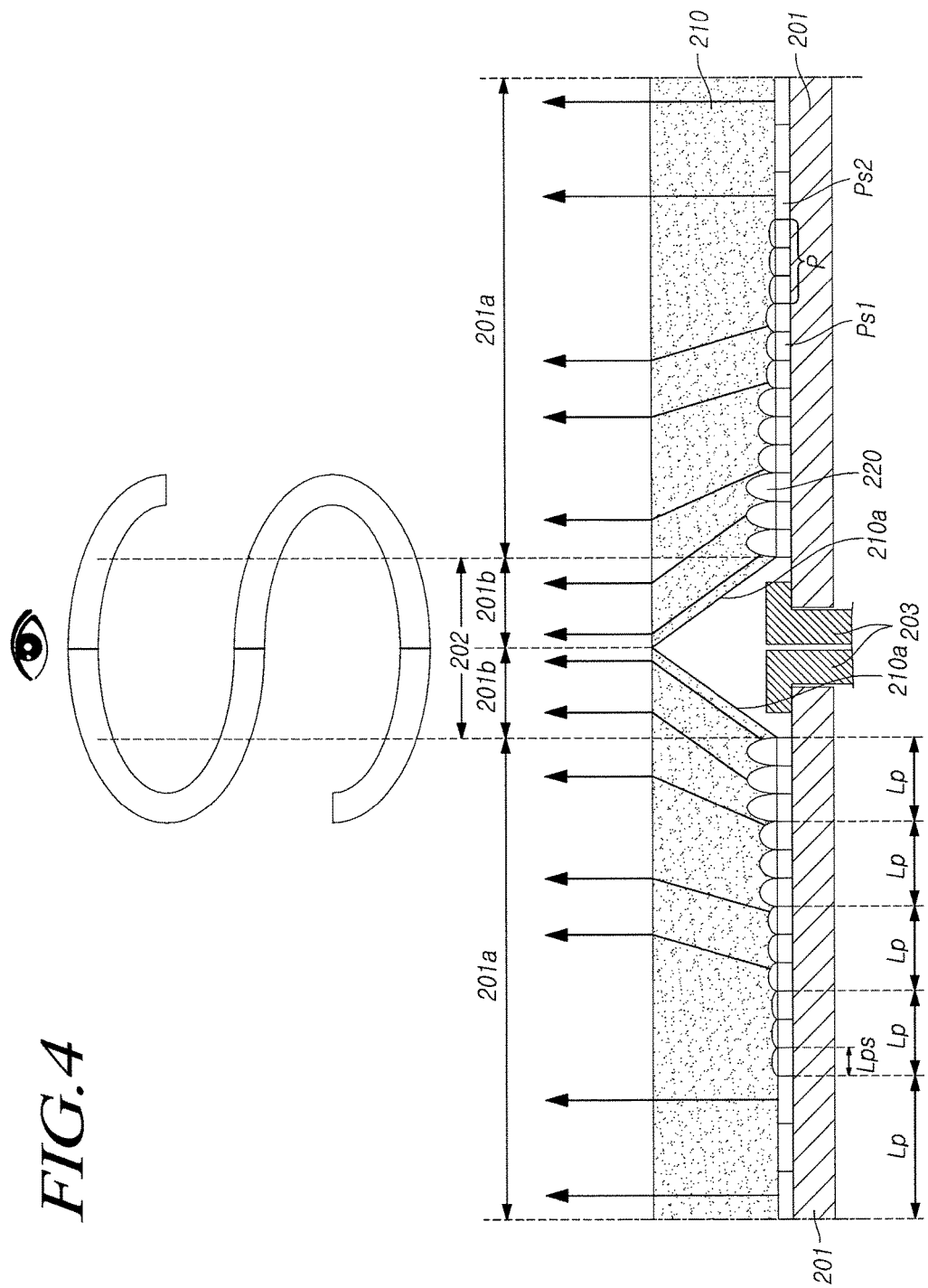
FIG. 4 is a cross-sectional view showing a boundary area in a video wall display device and is a view showing an image appearing in the frontal view according to embodiments of the present invention.
Figure 5:
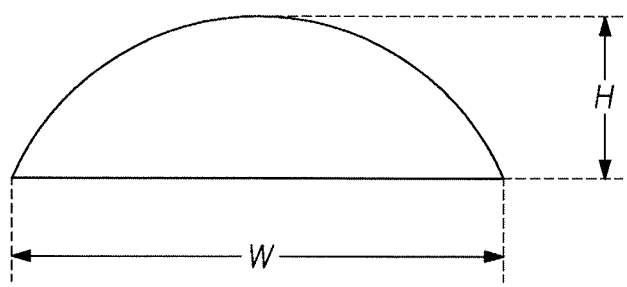
FIG. 5 is a sectional view illustrating a first optical member in a video wall display device according to embodiments of the present invention.
Figure 8:
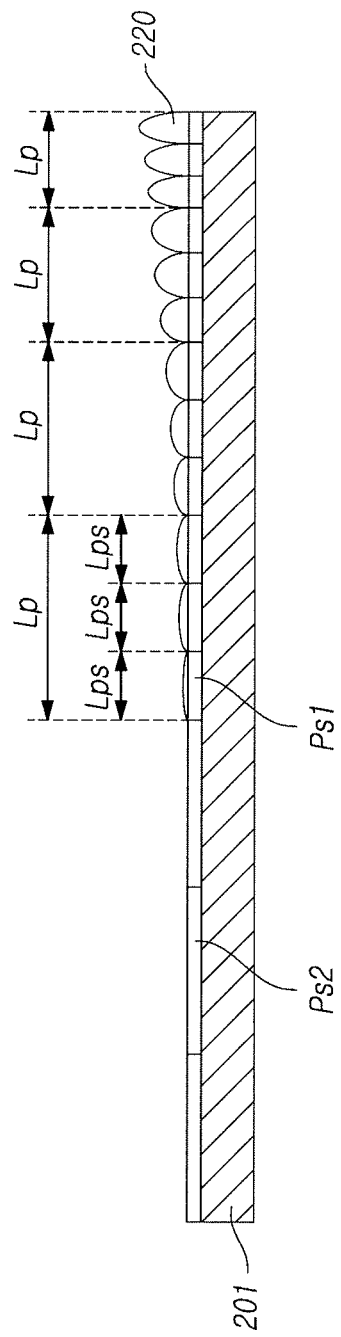
Figure 9:
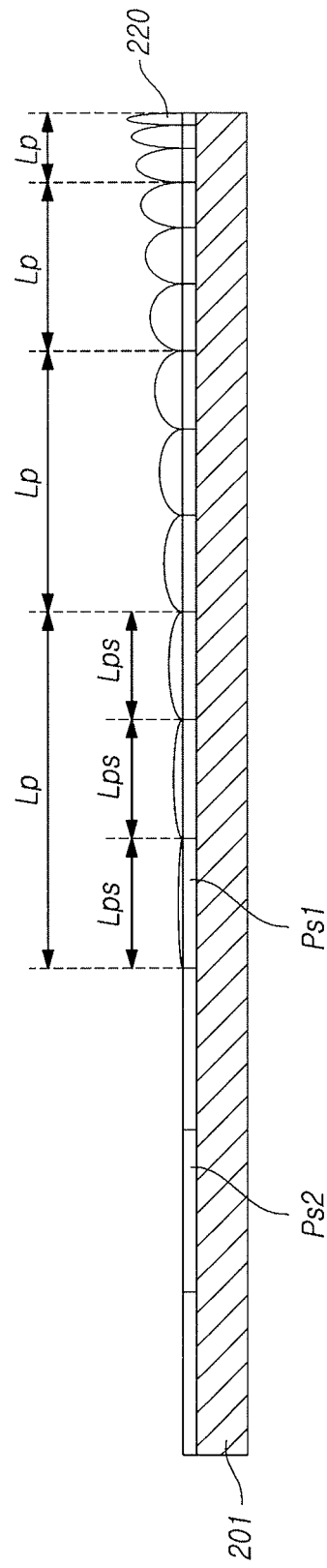
Figure 10:
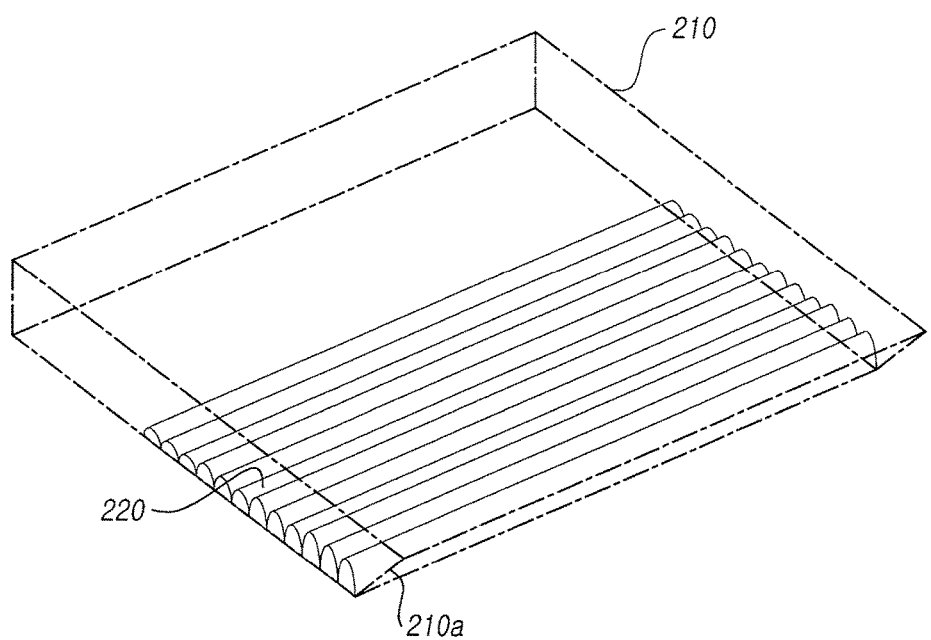
FIG. 10 is a perspective view schematically showing an example of a first optical member and a second optical member in a video wall display device according to embodiments of the present invention.

FIG. 2 is a front view schematically showing a video wall display device according to embodiments of the present invention, FIG. 3 is a cross-sectional view schematically showing a cross-section at the A-site in FIG. 2, FIG. 4 is a cross-sectional view showing a boundary area in a video wall display device and is a view showing an image appearing in the frontal view according to embodiments of the present invention, FIG. 5 is a sectional view illustrating a first optical member in a video wall display device according to embodiments of the present invention, FIGS. 6 to 9 are cross-sectional views showing a display panel and a first optical member in a video wall display device according to embodiments of the present invention, and FIG. 10 is a perspective view schematically showing an example of a first optical member and a second optical member in a video wall display device according to embodiments of the present invention.

As shown in the drawings, the video wall display device according to embodiments of the present invention can include a multi-panel unit 200 including at least two display panels 201 having ends connected to each other connected to each other; a first optical member 220 disposed on the upper side of a display area 201*a* at a side of ends of display areas 201*a* of the respective display panels 201, the display areas 201*a* being at least connected to each other at the side; and a second optical member 210 disposed on the entire upper surface of the multi-panel unit 200 and including a tapered surface 210*a*, which is inclined toward an adjacent display panel 201 in a view from the ends of the display areas 201*a*, at which the first optical members 220 are disposed on the display panels 201, toward the upper side of the portion at which the display panels 201 are connected to each other.

Referring first to FIGS. 2 and 3, the video wall display device includes a multi-panel unit 200 including at least two display panels 201 having ends connected to each other. However, the present invention is not limited thereto, and can be formed by connecting individual display devices to each other such that the ends of the display panels 201 are connected to each other.

When individual display devices are connected to each other, each individual display device configures one independent complete display device, and can be implemented by a Liquid Crystal Display (LCD) device, an organic light-emitting display (OLED) device, or the like.

A light guide plate 209 can be die-cut or extruded from a plastic sheet, or can be formed of an injection-molded rectangular transparent plastic sheet. Light from a light source such as light-emitting diode arrays 207 and 207*a* is emitted to the edge of the light guide plate 209 and diffuses across the back surface of the display panel 201 while being totally reflected inside the light guide plate 209, and the light emitted through a flat upper surface of the light guide plate 209 functions as a backlight of the display panel 201.

A reflective plate 209*b* is disposed on the back surface of the light guide plate 209 and functions to improve the luminance of light by reflecting light having passed through the back surface of the light guide plate 209 toward the display panel 201.

An optical sheet 209*a* on the upper portion of the light guide plate 209 includes a diffusion sheet and at least one light collecting sheet, and diffuses or concentrates light having passed through the light guide plate 209 so that a more uniform surface light source is incident on the display panel 201.

The multi-panel unit 200 corresponds to a display portion of the video wall display device in which display panels 201 are connected to display a single image. A portion at which the display panels 201 are connected to each other includes a portion in which an image is not displayed due to a connection of non-display areas (or bezels 201*b*) of the display panels 201. In the present specification, a portion at which the non-display areas 201*b* of the display panels 201 are connected to each other is defined as a boundary area 202.

Each of the display panels 201 includes a display area (Active Area, A/A) 201*a* in which an image is displayed in the center thereof, and a non-display area (Nonactive Area N/A) 201*b*, in which an image is not displayed, which is an area surrounding the edge of the display area 201*a*.

The non-display area 201b of the display panel 201 may be referred to as a bezel area or the like.

Furthermore, the multi-panel unit 200 can include: display panels 201 connected to each other; a backlight unit disposed under the display panels 201 to provide light to the display panels 201; and a support structure surrounding the bottom and side surfaces of the display panels 201.

The display panel 201 is generally manufactured by a first substrate and a second substrate attached to each other, in which the first substrate is an array substrate with a thin film transistor or the like is disposed to define a pixel area, and the second substrate is an upper substrate on which a black matrix and/or a color filter layer are formed. In a panel for an OLED display device, the second substrate can function only as a protective substrate.

In addition, the backlight unit can include: a light source module including a light source such as an LED, a holder for fixing the light source, and a light source driving circuit; a light guide plate 209 or a diffusion plate for diffusing light to the entire panel area; a reflective plate 209b for reflecting light toward the display panel 201; an LED flexible circuit for controlling on/off of the light source; and subunits, such as one or more optical films 209a or sheets, disposed on the light guide plate 209 to improve the luminance, and diffuse and project light.

In addition, the support structure surrounding the bottom and side surfaces of the display panel 201 can include a cover bottom 205 and/or a guide panel surrounding and protecting the backlight unit and the display panel 201 for each display device, and can also include a back cover in a unit of a set electronic device which is a final electronic product including a display device.

Also, each of the display panels 201 includes a non-display area (N/A) 201b in which an image is not displayed in a predetermined area of an edge thereof, and the video wall display device is formed by connecting a plurality of the display panels 201. Therefore, in the video wall display device, a phenomenon occurs in which an image is not displayed in a boundary area 202 where the display panels 201 are connected to each other.

The non-display area (N/A) 201b of each display panel 201 can include the non-display area 201b of the display panel 201 itself, and other portion(s) covered by the backlight unit, or a case top or a front cover covering the front surface of a display device.

Therefore, when a single image is displayed on a video wall display device or a multi-display device, an image disconnection phenomenon occurs in which no image is displayed in a boundary area 202 where non-display areas 201b are connected to each other. Accordingly, a first optical member 220 and a second optical member 210 are disposed as shown in FIGS. 3 and 4.

FIG. 4 is a cross-sectional view showing a boundary area and a connection portion between display panels 201 and is a view showing an image appearing in the frontal view. The first optical member 220 and the second optical member 210 for refracting or diffusing an optical path near a boundary area 202 can be disposed as a method for overcoming an image disconnection phenomenon in the boundary area 202.

The first optical member 220 is disposed on the upper side of a display area 201a at a side of ends of display areas 201a of the respective display panels 201 connected to each other, the display areas 201a being at least connected to each other at the side, so as to refract or diffuse the optical path to the connection portion, thereby reducing the image disconnection in the connection portion.

The first optical member 220 can be a lenticular lens, a Fresnel lens, or a convex lens, and the second optical member 210 can be a prism lens. However, the first optical member 220 and the second optical member 210 are not necessarily limited thereto.

Such a lenticular lens, a Fresnel lens, a convex lens, or a prism lens is a technology used in other fields for enlarging and/or refracting light, and therefore, a detailed description thereof will be omitted in the present specification.

In addition, all optical members capable of refracting and/or transmitting light from an adjacent sub-pixel Ps1 to the boundary area 202 of the video wall display device by the light refraction in the boundary area 202 can be used as the first optical member 220 and the second optical member 210 according to embodiments of the present invention.

The second optical member 210 disposed on the entire upper surface of the multi-panel unit 200 includes a tapered surface 210a, which is inclined toward an adjacent display panel 201 in a view from the ends of the display areas 201a, at which the first optical members 220 are disposed on the display panels 201 connected to each other, toward the upper side of the portion at which the display panels 201 are connected to each other. Therefore, the optical path is bent or diffused toward the upper surface of the second optical member 210 along the tapered surface 210a, in order to reduce image disconnection of the boundary area 202.

For example, the character "S" shown on the upper side of FIG. 4 appears in a viewer's view without being disconnected even in the boundary area 202, even though the left half of the "S" is provided by the display panel on the left and the right half of the "S" is provided by the display panel on the right.

In addition, a panel support member 203 is disposed in a connection portion between the display panels 201. The panel support member 203 is formed of a transparent material and is disposed between tapered surfaces 210a adjacent to each other in the second optical member 210, in order to connect and support the display panels 201 while also being invisible to a viewer. As a result, the image in the screen looks like a single seamless image with no cutting line.

The first optical member 220 is convexly protruded upward from a sub-pixel Ps1 at a side of ends of display areas 201a which are at least connected to each other, in order to refract a path of light emitted from the sub-pixel Ps1, so that light can be incident on the entire area of the second optical member 210.

Further, the size of a sub-pixel Ps1 in an area where the first optical member 220 is disposed is smaller than the size of a sub-pixel Ps2 in an area where the first optical member 220 is not disposed, so that it is possible to compensate for the loss of the resolution in an area where light is incident on the second optical member 210. For example, sub-pixels can be packed more densely around the edges of the display panel than the sub-pixel density at the center or main area of the display panel.

That is, even in the boundary area 202 where the non-display areas 201b existing between the display areas 201a of the respective display panels 201 are connected to each other, light is emitted through the second optical member 210. Therefore, the size of the sub-pixel Ps1 is smaller than the size of the sub-pixel Ps2 in the area where the first optical member 220 is not disposed, so that the amount of light and a refractive index increase to improve the resolution along the outer edges of the display panel.

Meanwhile, in order to increase the amount of light and a refractive index in the area in which the first optical member 220 is disposed, and compensate for the resolution in the boundary area 202 where the display panels 201 are connected to each other, the size Lps of a sub-pixel Ps1 and the size Lp of a pixel P can be changed in the area where the first optical member 220 is disposed. For example, the sizes of the pixels and the sub-pixels near the edges of the display panel can be made smaller in order to increase the pixel/sub-pixel density.

The sub-pixel Ps1 expresses a single color and a pixel P defined by two or more sub-pixels Ps1 expresses various colors according to a signal of a screen control unit. The pixel size Lp, the sub-pixel size Lps, and a protrusion amount and the radius of curvature of the first optical member 220 can be variously changed for increasing the amount of light and compensating for the resolution in the boundary area 202 where the display panels 201 are connected to each other.

Figure 6:
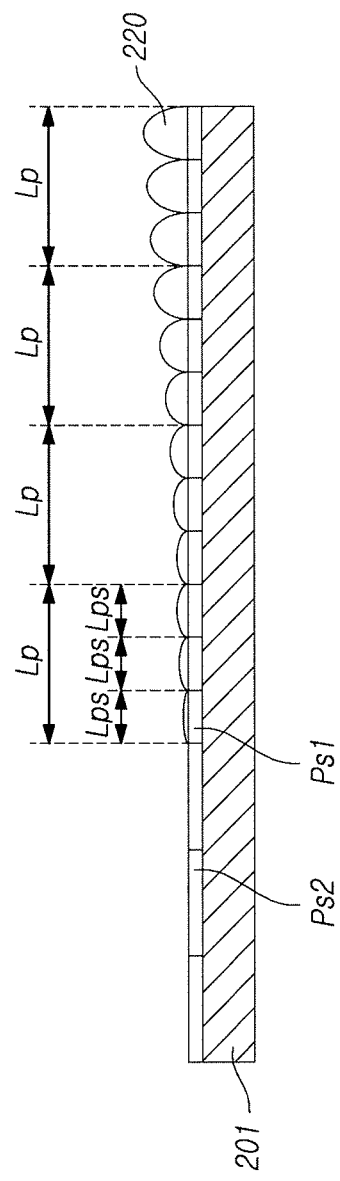
FIGS. 6 to 9 are cross-sectional views showing a display panel and a first optical member in a video wall display device according to embodiments of the present invention.

First, as shown in FIGS. 4 and 6, the sizes Lps of sub-pixels Ps1 in an area where the first optical member 220 is disposed can be the same, and the sizes Lp of pixels P including the sub-pixels Ps1 can also be the same.

When the sizes Lps of the sub-pixels Ps1 in the area where the first optical member 220 is disposed are the same, a manufacturing process of the sub-pixels Ps1 is simplified, a manufacturing cost is reduced, the amount of light can be increased and the resolution can be compensated in the boundary area 202 in which the display panels 201 are connected to each other.

In addition to varying the sizes of the pixel P and the sub-pixel Ps1, both a protrusion amount (e.g., protrusion height) of the first optical member 220 and the radius of curvature of the outer circumferential surface of the first optical member 220 (e.g., the degree of curvature on the surface of the protrusion) can also be varied. Referring to FIG. 4, a protrusion amount (e.g., the height) of the first optical member 220 gradually increases for each pixel P defined by at least two sub-pixels Ps1 and the radius of curvature of the outer circumferential surface of the first optical member 220 decreases, in a direction toward the end at which the display panels 201 are connected to each other (e.g., the rounded protrusions get higher and more pointed nearer to the edge of the display panel, and the rounded protrusions get shorter and flatter the farther they are away from the edge of the display panel).

That is, as shown in FIGS. 4 and 5, the first optical member 220 is formed to have a convex upper surface and a width W equal to the width of the sub-pixel Ps1 to refract light of the entire sub-pixel Ps1 area, allow the light to be incident on the second optical member 210, and change the radius of curvature of the outer circumferential surface thereof according to a protrusion amount H (e.g., height) up to the upper surface thereof.

Accordingly, a protrusion amount of the first optical member 220 disposed on the sub-pixel Ps1 increases while the radius of curvature of the outer circumferential surface of the first optical member 220 decreases (e.g., the rounded protrusions become taller and pointier they closer they are to the edge of the display panel), so that the amount of light incident on the second optical member 210 through the first optical member 220 increases and a refractive index increases. As a result, the amount of light refracted toward the end at which the display panels 201 are connected to each other increases, thereby preventing the resolution from being lowered.

When the amount of light refracted toward the end at which the display panels 201 are connected to each other increases, light is refracted through the first optical member 220 and the second optical member 210 even if a connection portion of the non-display areas 201b of the display panels 201 connected to each other is widened, so that the light can be incident in a user's line of sight.

Therefore, when viewed from the upper front side of the video wall display device, as shown in the upper drawing of FIG. 4, an image of adjacent pixels is refracted and projected to display a predetermined image even in an overlapping portion of the non-display areas 201b. Therefore, an image disconnection phenomenon in a connection portion between the display panels 201 can be compensated.

In reference to an embodiment of a pixel size Lp, a sub-pixel Ps1 size Lps, a protrusion amount of the first optical member 220, and the radius of curvature of the first optical member 220 in an area in which the first optical member 220 is disposed, in FIG. 6, the sizes Lps of sub-pixels Ps1 are the same and the sizes Lp of pixels including the sub-pixels Ps1 are the same in an area where the first optical member 220 is disposed.

A protrusion amount (e.g., height) of the first optical member 220 gradually increases for each sub-pixel Ps1 and the radius of curvature of the outer circumferential surface of the first optical member 220 gradually decreases for each sub-pixel Ps1, in a direction toward the end at which the display panels 201 are connected to each other.

Therefore, the amount of light incident on the second optical member 210 through the first optical member 220 increases and a refractive index increases. As a result, the amount of light refracted toward the end at which the display panels 201 are connected to each other increases, thereby preventing the resolution from being lowered.

When the amount of light refracted toward the end at which the display panels 201 are connected to each other increases, light is refracted through the first optical member 220 and the second optical member 210 even if the connection portion of the non-display areas 201b of the display panels 201 connected to each other is widened, so that an image disconnection phenomenon in a connection portion between the display panels 201 can be compensated.

Figure 7:
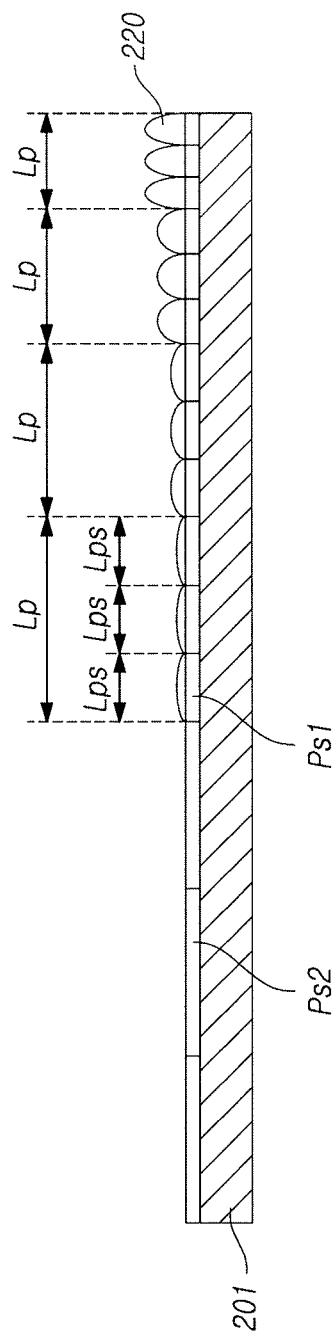

In embodiments shown in FIGS. 7 to 9, the size Lp of a pixel including sub-pixels Ps1 becomes smaller in a direction toward the end where the display panels 201 are connected to each other.

Here, in embodiments shown in FIGS. 7 and 8, the pixel size Lp becomes smaller in a direction toward the end where the display panels 201 are connected to each other and the sizes Lps of sub-pixels Ps1 within each pixel are the same in a corresponding pixel area.

The pixel size Lp gradually decreases in a direction toward the end at which the display panels 201 are connected to each other. However, sub-pixels Ps1 in each pixel have the same size Lps. Therefore, the sizes Lps of the sub-pixels Ps1 gradually decrease for each pixel in a direction toward the end at which the display panels 201 are connected to each other.

Here, in an embodiment shown in FIG. 7, a protrusion amount (e.g., height) of the first optical member 220 increases for each pixel and the radius of curvature of the outer circumferential surface of the first optical member 220 decreases, in a direction toward the end at which the display panels 201 are connected to each other. In each of the pixels, the first optical members 220 are formed to protrude by the same amount within a same pixel, and the outer circumferential surfaces of the first optical members 220 are formed to have the same radius of curvature within a same pixel.

In this instance, the manufacturing of the first optical member 220 in each pixel can be simplified and the process can be reduced. Further, the amount of light incident on the second optical member 210 through the first optical member 220 increases and a refractive index increases, so that the amount of light refracted toward the end at which the display panels 201 are connected to each other increases, thereby preventing the resolution from being lowered.

Further, in an embodiment shown in FIG. 8, the pixel size Lp becomes smaller in a direction toward the end where the display panels 201 are connected to each other and the sizes Lps of sub-pixels Ps1 forming each pixel are the same in a corresponding pixel area.

That is, the pixel size Lp gradually decreases in a direction toward the end at which the display panels 201 are connected to each other. However, sub-pixels Ps1 in each pixel have the same size Lps. Therefore, the sizes Lps of the sub-pixels Ps1 gradually decrease for each pixel in a direction toward the end at which the display panels 201 are connected to each other.

Here, in an embodiment shown in FIG. 8, a protrusion amount (e.g., height) of the first optical member 220 gradually increases for each sub-pixel Ps1 and the radius of curvature of the outer circumferential surface of the first optical member 220 gradually decreases, in a direction toward the end at which the display panels 201 are connected to each other.

In this instance, since sub-pixels Ps1 in each pixel have the same size Lps, the manufacturing of a pixel can be simplified and the process can be reduced. Further, the amount of light incident on the second optical member 210 through the first optical member 220 gradually increases and a refractive index gradually increases, thereby preventing the resolution from being lowered in an overlapping portion of the non-display areas 201b where the display panels 201 are connected to each other.

In addition, in an embodiment shown in FIG. 9, the pixel size Lp becomes smaller in a direction toward the end where the display panels 201 are connected to each other, and the sizes Lps of sub-pixels Ps1 forming each pixel also decreases.

That is, the pixel size Lp gradually decreases in a direction toward the end at which the display panels 201 are connected to each other, and the sizes Lps of sub-pixels Ps1 in each pixel also becomes smaller in a direction toward the end at which the display panels 201 are connected to each other. Therefore, the sizes of the sub-pixels Ps1 gradually decrease for each sub-pixel Ps1.

Here, in an embodiment shown in FIG. 9, a protrusion amount of the first optical member 220 gradually increases for each sub-pixel Ps1 and the radius of curvature of the outer circumferential surface of the first optical member 220 gradually decreases, in a direction toward the end at which the display panels 201 are connected to each other. In other words, the height of the sub-pixel protrusions increase, the sub-pixel protrusions get pointier and the size of the corresponding sub-pixels get smaller, on a per sub-pixel basis, as it gets closer to the edge of the display panel.

In this instance, the pixel size Lp and the sub-pixel size Lps gradually decrease in a direction toward the end at which the display panels 201 are connected to each other, at the same time, a protrusion amount (e.g., height) of the first optical member 220 gradually increases and the radius of curvature of the outer circumferential surface of the first optical member 220 gradually decreases. Therefore, the amount of light incident on the second optical member 210 through the first optical member 220 gradually increases and a refractive index gradually increases, so that a viewer can not recognize a difference in the resolution between an overlapping portion of the non-display areas 201b in which the display panels 201 are connected to each other and a peripheral display area 201a.

The first optical member 220 and the second optical member 210 are integrally formed as shown in FIG. 10 in embodiments of the present invention, but the present invention is not limited thereto. The first optical member 220 and the second optical member 210 can be separately manufactured and coupled to each other, and the first optical member 220 can be formed on each sub-pixel one by one (e.g., one protrusion per sub-pixel). However, a single first optical member 220 can be lengthily formed in a connection direction of sub-pixels as shown in FIG. 10 in consideration of ease of the manufacturing and manufacturing cost (e.g., one protrusion across a row of sub-pixels).

In addition, it should be understood that a display panel 201 that can be used in embodiments of the present invention can be a liquid crystal display panel but is not limited thereto, and the display panel 201 can include all types of display panels such as a plasma display panel, an organic light-emitting display (OLED) panel, and the like.

Further, in a liquid crystal display panel, the liquid crystal display panel can include: an array substrate including a plurality of gate lines and data lines, a pixel defined in an intersection area of the lines, and a Thin Film Transistor (TFT) which is a switching element for controlling light transmittance in each pixel; an upper substrate having a color filter and/or a black matrix, etc.; and a liquid crystal material layer formed therebetween, in which a touch window can be additionally disposed on the entire upper surface of the display panel.

An organic electroluminescent display panel can include: an array substrate including a plurality of gate lines and data lines, a pixel defined in an intersection area of the lines, and a Thin Film Transistor (TFT) which is a switching element for selectively applying an electrical signal to an organic electroluminescent material layer provided in each pixel; a protective upper substrate; and the like.

In addition, in embodiments of the present invention, a diffusion plate formed of a light-transmitting material that diffuses light from the second optical member 210 can be disposed on the second optical member 210, in which the diffusion plate is a plate-shaped member that can diffuse or disperse light incident from the second optical member 210 in various directions, and the diffusion plate may be formed of a polymer resin such as Poly-Methyl Methacrylate (PMMA), Poly Carbonate (PC), Poly Ether Sulfone (PES), or Methacrylate Styrene (MS).

As described above, according to embodiments of the present invention, it is possible to solve a problem of image discontinuity in a connection portion between display panels.

In addition, according to embodiments of the present invention, a video wall display device includes two optical members having different properties on the upper portion thereof, thereby providing an image, which is seamless even at a connection portion between display panels, and maintaining the resolution of the connection portion between the display panels to be the same as that of a display area.

Even if it was described above that all of the components of an embodiment of the present invention are coupled as a single unit or coupled to be operated as a single unit, the present invention is not necessarily limited to such an embodiment. That is, at least two elements of all structural elements can be selectively joined and operate without departing from the scope of the present invention.

In addition, since terms, such as "including" "comprising" and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present invention expressly defines them so.

Although a preferred embodiment of the present invention has been described for illustrative purposes, those skilled in the art will appreciate that various modifications, additions and substitutions are possible, without departing from the scope and spirit of the invention as disclosed in the accompanying claims. Therefore, embodiments disclosed in the present invention are intended to illustrate the scope of the technical idea of the present invention, and the scope of the present invention is not limited by the embodiments. The scope of the present invention shall be construed based on the accompanying claims so all of the technical ideas included within the scope equivalent to the claims belong to the present invention.

What is claimed is:

1. A video wall display device, comprising:
   a multi-panel unit including a first display panel and a second display panel, the first display panel having a first display area adjacent to the second display panel having a second display area;
   a first optical member disposed adjacent to a boundary between the first display area and the second display area; and
   a second optical member disposed on the first optical member, across the multi-panel unit and including a tapered portion,
   wherein the tapered portion of the second optical member is inclined from an edge of the first display area or an edge of the second display area toward the boundary between the first display area and the second display area, and
   wherein the first optical member is formed to have a convex upper surface.

2. The video wall display device of claim 1, wherein the first optical member includes a lenticular lens, a Fresnel lens, or a convex lens overlapping at least one sub-pixel.

3. The video wall display device of claim 1, further comprising:
   a transparent panel support member disposed at the boundary between the first display area and the second display area and in a connection portion between the first and second display panels,
   wherein the transparent panel support member overlaps with the tapered portion of the second optical member.

4. The video wall display device of claim 1, wherein the first optical member is convexly protruded away from a sub-pixel located at a side of the first or second display area, and
   wherein a size of a sub-pixel overlapping with the first optical member is smaller than a size of a sub-pixel that does not overlap with the first optical member.

5. The video wall display device of claim 4, wherein sub-pixels overlapping with the first optical member have a same size.

6. The video wall display device of claim 4, wherein the first optical member includes a plurality of protrusions corresponding to a plurality of pixels, each of the plurality of pixels including at least two sub-pixels, and
   wherein a height of each of the plurality of protrusions increases on a per pixel basis and a radius of curvature of an outer circumferential surface of each of the plurality of protrusions decreases, in a direction toward the boundary between the first display area and the second display area.

7. The video wall display device of claim 6, wherein each of the plurality of protrusions corresponds to an individual sub-pixel or a row of sub-pixels.

8. The video wall display device of claim 4, wherein the first optical member includes a plurality of protrusions corresponding to a plurality of pixels, each of the plurality of pixels including at least two sub-pixels, and
   wherein a height of each of the plurality of protrusions increases on a per sub-pixel basis and a radius of curvature of an outer circumferential surface of each of the plurality of protrusions decreases, in a direction toward the boundary between the first display area and the second display area.

9. The video wall display device of claim 4, wherein the first optical member includes a plurality of protrusions corresponding to a plurality of pixels, each of the plurality of pixels including at least two sub-pixels, and
   wherein a height of each of the plurality of protrusions increases on a per sub-pixel basis and a radius of curvature of an outer circumferential surface of each of the plurality of protrusions decreases on a per sub-pixel basis, in a direction toward the boundary between the first display area and the second display area.

10. The video wall display device of claim 4, wherein a plurality of pixels each including at least two sub-pixels are disposed in the first or second display area and the plurality of pixels decrease in size in a direction toward the boundary between the first display area and the second display area,
    wherein a height of the first optical member increases in the direction toward the boundary between the first display area and the second display area, and
    wherein the first optical member includes a plurality of protrusions each having a radius of curvature of an outer circumferential surface that decreases in the direction toward the boundary between the first display area and the second display area.

11. The video wall display device of claim 10, wherein a height of each of the plurality of protrusions increases on a per sub-pixel basis and the radius of curvature of the outer circumferential surface of each of the plurality of protrusions decreases on a per sub-pixel basis, in a direction toward the boundary between the first display area and the second display area.

12. The video wall display device of claim 4, wherein the first or second display area includes a plurality of sub-pixels that become smaller on a per sub-pixel basis, in a direction toward the boundary between the first display area and the second display area,
    wherein the first optical member includes a plurality of protrusions corresponding to a plurality of pixels, each of the plurality of pixels including at least two sub-pixels,
    wherein a height of each of the plurality of protrusions increases on a per sub-pixel basis, in the direction toward the boundary between the first display area and the second display area, and
    wherein a radius of curvature of an outer circumferential surface of each of the plurality of protrusions decreases, in the direction toward the boundary between the first display area and the second display area.

13. The video wall display device of claim 4, wherein the first optical member includes a plurality of protrusions corresponding to a plurality of pixels, each of the plurality of pixels including at least two sub-pixels, and wherein the plurality of protrusions become shorter, flatter and less pointy, in a direction away from the boundary between the first display area and the second display area.

14. A display device, comprising:

a first display panel having a first display area and a first edge;

a second display panel having a second display area and a second edge disposed adjacent to the first edge of the first display panel;

a first optical member including first and second portions corresponding to the first and second edges, respectively; and a second optical member overlapping with the first and second portions of the first optical member and overlapping with a boundary between the first and second display panels, wherein the second optical member includes first and second tapered portions respectively extending with an inclined angle from the first and second edges to the boundary between the first and second display panels, and wherein the first optical member is formed to have a convex upper surface.

15. The display device of claim 14, wherein the first portion of the first optical member includes a plurality of first protrusions corresponding to a plurality of first pixels, each of the plurality of first pixels including at least two sub-pixels, wherein the second portion of the second optical member includes a plurality of second protrusions corresponding to a plurality of second pixels, each of the plurality of second pixels including at least two sub-pixels, and wherein each of the plurality of first and second protrusions has a rounded shaped.

16. The display device of claim 15, wherein the plurality of first protrusions and the plurality of second protrusions increase in height, in a direction toward the boundary between the first and second display panels.

17. The display device of claim 15, wherein the plurality of first protrusions and the plurality of second protrusions get pointier, in a direction toward the boundary between the first and second display panels.

18. The display device of claim 15, wherein a first set of subpixels and a second set of subpixels respectively corresponding to the plurality of first protrusions and the plurality of second protrusions decease in size, in a direction toward the boundary between the first and second display panels.

19. The display device of claim 15, wherein the plurality of first protrusions and the plurality of second protrusions increase in height on a per sub-pixel basis or on a per pixel basis, in a direction toward the boundary between the first and second display panels, wherein the plurality of first protrusions and the plurality of second protrusions each have a radius of curvature of an outer circumferential surface that decreases on a per sub-pixel basis or on a per pixel basis, in the direction toward the boundary between the first and second display panels, and wherein a first set of subpixels and a second set of subpixels respectfully corresponding to the plurality of first protrusions and the plurality of second protrusions decease in size on a per sub-pixel basis or on a per pixel basis, in the direction toward the boundary between the first and second display panels.

20. The display device of claim 15, wherein each of the plurality of first protrusions and the plurality of second protrusions corresponds to an individual sub-pixel or a row of sub-pixels.

* * * * *